United States Patent [19]

Carlson

[11] 3,881,119

[45] Apr. 29, 1975

[54] LIGHT SENSITIVE ZERO VOLTAGE SWITCH

[75] Inventor: Elmer A. Carlson, Agoura, Calif.

[73] Assignee: International Telephone and Telegraph Corporation, New York, N.Y.

[22] Filed: Feb. 4, 1974

[21] Appl. No.: 439,000

Related U.S. Application Data

[62] Division of Ser. No. 345,899, March 29, 1973, Pat. No. 3,815,668.

[52] U.S. Cl... 307/252 T; 307/252 B; 307/252 UA; 307/310

[51] Int. Cl. .......... H03k 17/00

[58] Field of Search...... 307/252 T, 252 B, 252 UA, 307/310; 323/25

[56] References Cited

UNITED STATES PATENTS

| | | | |
|---|---|---|---|
| 3,648,075 | 3/1972 | Mankovitz | 307/252 UA |
| 3,660,686 | 5/1972 | Muskovac | 307/252 T |
| 3,723,769 | 3/1973 | Collins | 307/252 UA |
| 3,758,793 | 9/1973 | Pascente | 307/252 UA |
| 3,816,763 | 6/1974 | Korn et al. | 307/252 UA |

*Primary Examiner*—Michael J. Lynch
*Assistant Examiner*—B. P. Davis
*Attorney, Agent, or Firm*—A. Donald Stolzy

[57] ABSTRACT

A system for heating and/or cooling utilizing a new two-wire thermostat and/or a zero voltage switch. Plural stages of heating and/or cooling may be provided with a single two-wire thermostat. That is, the sensor may be a dual automatic changeover thermostat. The heat control signal may be positive. The cool control signal may then be negative. Diodes are employed to pick the control signals by their polarities. The zero voltage switch inhibits firing of a triac unless the A.C. input voltage is near crossover. Three embodiments of zero voltage switches are disclosed. One provides pulsed current to limit the heat output of an electric heating element. Another provides, e.g., a two minute inhibit signal to prevent a cooling system compressor from being turned on immediately after it has been turned off. This is desirable to protect the cooling system from damage.

1 Claim, 5 Drawing Figures

LIGHT SENSITIVE ZERO VOLTAGE SWITCH

BACKGROUND OF THE INVENTION

This application is a division of copending application Ser. No. 345,899 filed Mar. 29, 1973 now U.S. Pat. No. 3,815,668, of the same inventor as this application. The benefit of the filing date of said copending application is, therefore, hereby claimed for this application.

This invention relates to systems for heating and/or air conditioning, and more particularly, to low cost multiple purpose apparatus for providing one or more stages of heating and/or cooling.

In the past, means for controlling both heating and cooling required considerable complex wiring and components. This complexity is increased when electric heating is employed because electric heating often requires that two or more heating elements be turned on in succession.

Conventional devices to control A.C. currents called zero voltage switches may be employed in electric heating; however, these conventional devices are more complex and expensive than they should be.

SUMMARY OF THE INVENTION

In accordance with the present invention, the above-described and other disadvantages of the prior art are overcome by providing a system for heating and/or air conditioning, and/or a thermostat and/or a zero voltage switch.

The system distinguishes between heat and cool signals by the polarities thereof.

The zero voltage switches of the present invention are less complex and less expensive than prior art devices which have similar functions.

One zero voltage switch of the present invention provides current pulses to an electric heater to limit the heat output thereof.

Still another zero voltage switch of the present invention prevents a compressor from being turned on immediately after it has been turned off.

The above-described and other advantages of the present invention will be better understood from the following detailed description when considered in connection with the accompanying drawings.

BRIEF DESCRIPTION OF THE DRAWINGS

In the drawings which are to be regarded as merely illustrative.

DESCRIPTION OF THE PREFERRED EMBODIMENTS

Figure 1:
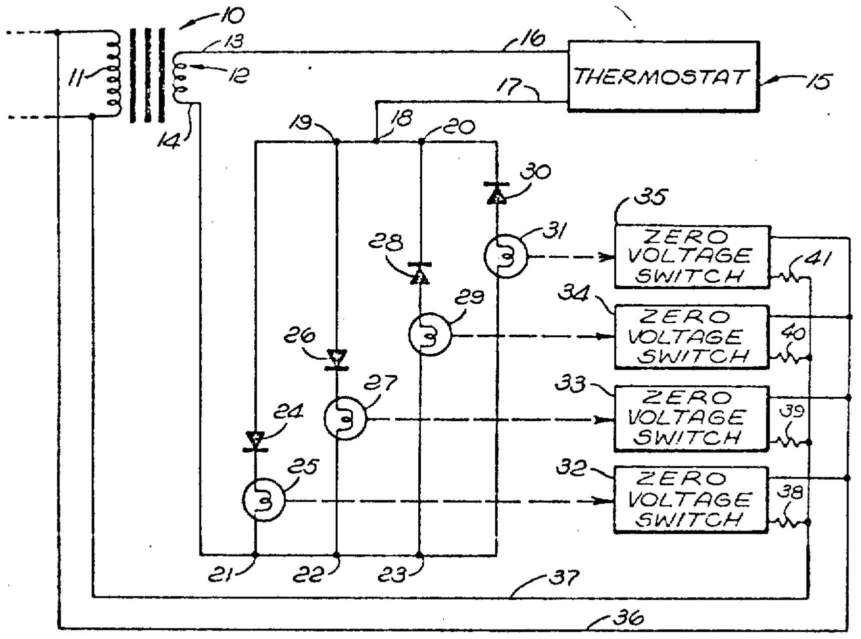
FIG. 1 is a schematic diagram of one embodiment of the system of the present invention.

In FIG. 1, transformer 10 is provided having a primary winding 11 and a secondary winding 12. An A.C. voltage is impressed across primary 11. This voltage may be 240 volts, if desired.

The voltage which appears across secondary 12 may be 24 volts, if desired.

Secondary 12 has leads 13 and 14 connected from the respective opposite ends thereof.

A thermostat 15 has leads 16 and 17. Leads 13 and 16 are connected together.

Various junctions 18, 19, 20, 21, 22 and 23 are provided throughout the circuit.

Thermostat lead 17 is connected to junction 18. Secondary lead 14 is connected to junction 21. A diode 24 and an incandescent lamp 25 are connected in succession in that order from junction 19 to junction 21.

Junctions 18, 19 and 20 are connected together. Junctions 21, 22 and 23 are connected together.

A diode 26 and an incandescent lamp 27 are connected in succession in that order from junction 19 to junction 22. A diode 28 and an incandescent lamp 29 are connected in succession in that order from junction 20 to junction 23.

Similarly, a diode 30 and an incandescent lamp 31 are connected in succession in that order from junction 20 to junction 23.

It is an important point to one feature of the present invention that diodes 24 and 26 are poled to be conductive in directions toward lamps 25 and 27, respectively; whereas, diodes 28 and 30 are poled to be conductive in a direction away from lamps 29 and 31, respectively.

Zero voltage switches are provided at 32, 33, 34 and 35 to receive the respective light outputs of lamps 25, 27, 29 and 31.

Zero voltage switches 32, 33, 34 and 35 are provided with input power over leads 36 and 37.

The zero voltage switch 32 controls electric current to an electric heating element 38. Zero voltage switch 33 controls the current to an electric heating element 39. Zero voltage switch 34 controls electric current to cooling apparatus 40. Zero voltage switch 35 controls the current to cooling apparatus 41.

OPERATION

In the operation of the system of FIG. 1, if the space around theremostat 15 contains air at a temperature below the set point, illumination of at least one of the lamps 25 and 27 will eventually be provided and this illumination may also increase. If the illumination so provided has an intensity which is sufficiently high, current may be provided to one of the corresponding electric heating elements 38 and 39. Should the temperature drop even further, both of the heating elements 38 and 39 will receive current. Zero voltage switches 32 and 33 may thus operate in steps. It has been found that, although zero voltage switches 32 and 33 will ordinarily operate in steps without any special construction, the circuits thereof may be modified, if desired, to make them operate in steps. The same is true of the zero voltage switches 34 and 35 used for cooling.

As stated previously, the direction in which the diodes 24, 26, 28 and 30 are poled is important. This is true because thermostat 15 produces output signals of one polarity when heating is called for, and signals of the opposite polarity when cooling is called for.

Figure 3:
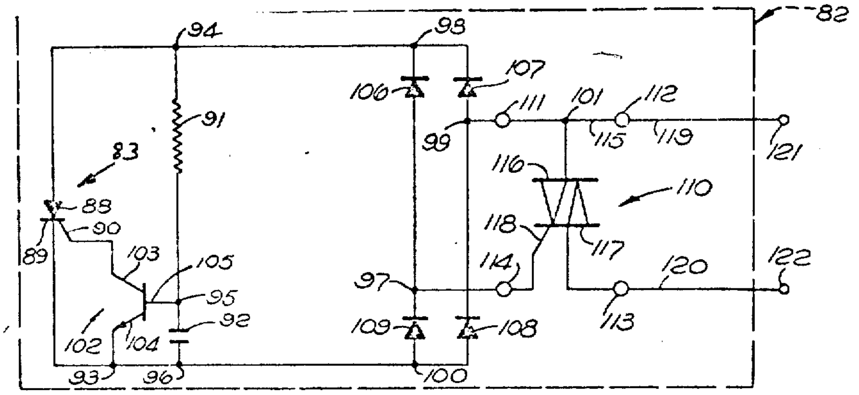
FIGS. 3, 4 and 5 are schematic diagrams of zero voltage switches constructed in accordance with the present invention.
Figure 4:
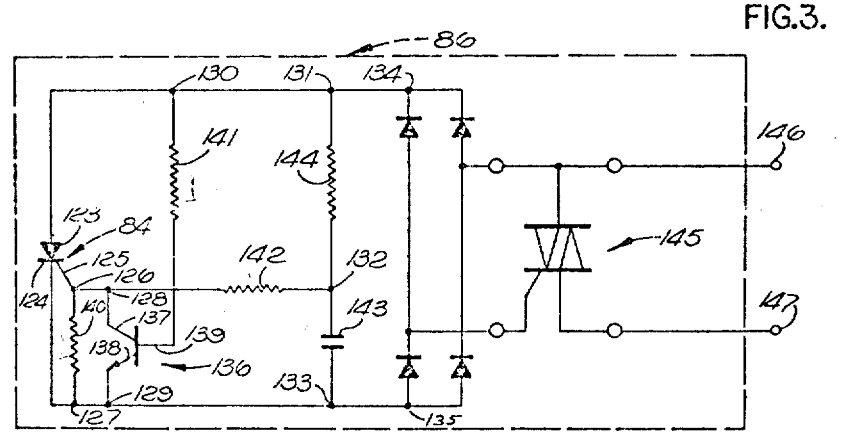
Figure 5:
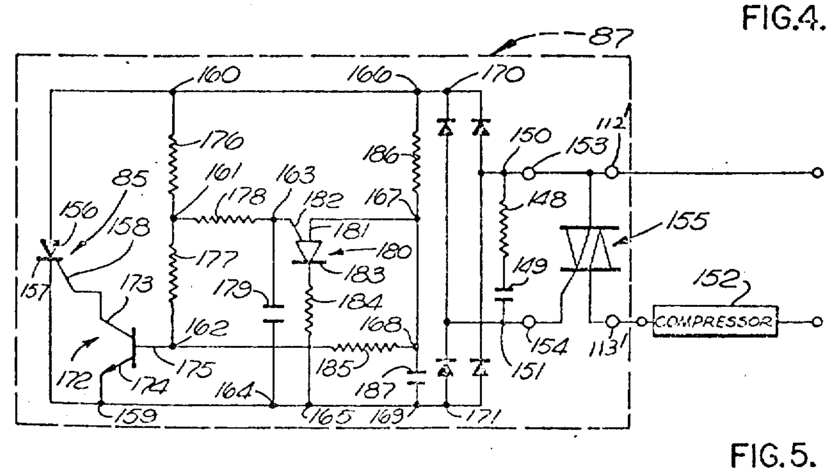

Any one of the zero voltage switches 32-35, shown in FIG. 1, may be conventional or of a type illustrated in any one of FIGS. 3, 4 and 5. If one or more of the zero voltage switches 32–35 is of a conventional type, it may be of the type conventionally identified as "Monsanto MCS2 Optoisolator." However, if this conventional zero voltage switch is employed, an incandescent lamp is employed therewith rather than a light emitting diode as disclosed in Monsanto Bulletin AN502.

Figure 2:
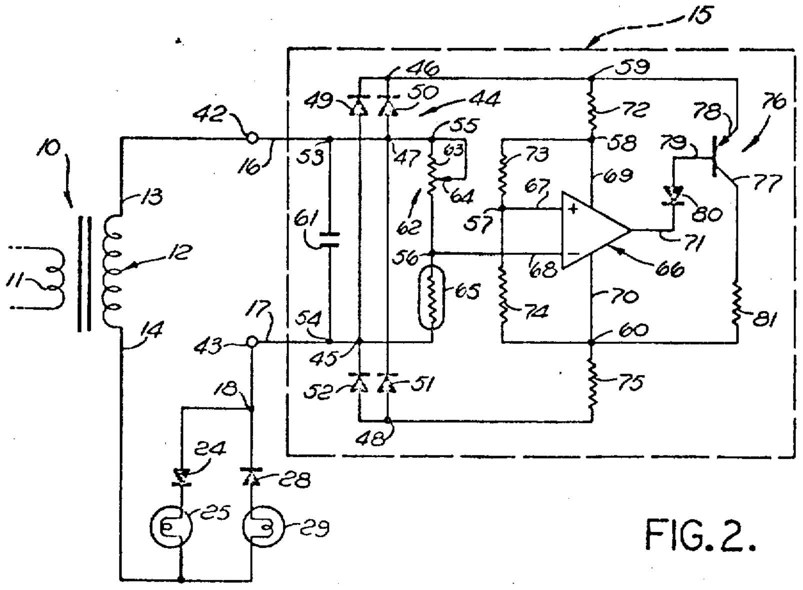
FIG. 2 is a schematic diagram of portions of the circuit shown in FIG. 1.

In FIG. 2, transformer 10 is again shown with primary and secondary windings 11 and 12, respectively. Secondary lead 13 is connected to a thermostat terminal 42. Thermostat lead 16 is also connected to thermostat terminal 42. Thermostat lead 17 is connected to thermostat terminal 43. Thermostat terminal 43 is then connected to junction 18. Diodes 24 and 28, and the respective lamps 25 and 29, are also shown in FIG. 2. The remainder of the diodes and lamps have been omitted from FIG. 2 for clarity's sake. The same thing is true of all of the zero voltage switches 32–35.

Thermostat 15, as shown in FIG. 2, includes a full wave bridge rectifier 44 having corners or junctions 45, 46, 47 and 48. A diode 49 is connected from junction 45 to junction 46 and poled to be conductive in a direction toward junction 46. A diode 50 is connected from junction 47 to junction 46, and is poled to be conductive in a direction toward junction 46. A diode 51 is connected from junction 48 to junction 47, and is poled to be conductive in a direction toward junction 47. A diode 52 is connected from junction 48 to junction 45, and is poled to be conductive in a direction toward junction 45.

Other junctions are provided throughout the circuit. These junctions include junctions 53, 54, 55, 56, 57, 58, 59 and 60. Junctions 47, 53 and 55 are all connected to thermostat lead 16. Junctions 45 and 54 are connected to thermostat lead 17. A capacitor 61 is connected between junctions 53 and 54.

A potentiometer 62 is provided having a winding 63 and a wiper 64.

Winding 63 is connected between junctions 55 and 56. Wiper 64 is connected to junction 55. A thermistor 65 is connected between junctions 45 and 56.

Junctions 46 and 59 are connected together.

An amplifier 66 is provided having a non-inverting input lead 67, an inverting input lead 68, a positive power input lead 69, a negative power input lead 70 and an output lead 71.

Leads 67 and 68 are connected respectively from junctions 57 and 56. Leads 69 and 70 are connected from junctions 58 and 60, respectively. A resistor 72 is connected between junctions 58 and 59. A resistor 73 is connected between junctions 57 and 58. A resistor 74 is connected between junctions 57 and 60. A resistor 75 is connected between junctions 48 and 60. A transistor 76 is provided having a collector 77, an emitter 78 and a base 79. A light emitting diode 80, provided simply to produce an indication of whether the resistance between terminals 42 and 43 is high or low, is connected from transistor base 79 to amplifier output lead 71 and is poled to be conductive in a direction toward the lead 71.

Transistor emitter 78 is connected from junction 59.

A resistor 81 is connected between transistor collector 77 and junction 60.

Note will be taken that potentiometer 62 and thermistor 65 are connected directly across the line, i.e., directly across terminals 42 and 43. Thus, alternately, the end of potentiometer winding 63 connected to junction 55 receives the high positive potential, while in the other half cycle, the lower end of thermistor 65 receives the high positive potential.

One embodiment of the present invention including a zero voltage switch is illustrated at 82 in FIG. 3. The zero voltage switch 82 includes a silicon-controlled rectifier (SCR) 83. An SCR identical to the SCR 83 shown in FIG. 3 may be employed at 84 and 85 in zero voltage switches 86 and 87, respectively.

All of the SCR's 83, 84 and 85 are of a special, but conventional, type. The SCR 83 may be described as a "photo SCR" or as a "light activated SCR." In any event, SCR 83 is photosensitive.

SCR 83 has an anode 88, a cathode 89 and a gate 90.

In zero voltage switch 82, a resistor 91 is also provided with a capacitor 92. Various junctions are provided at 93, 94, 95, 96, 97, 98, 99, 100 and 101.

Junctions 94 and 98 are connected together. Junctions 93, 96 and 100 are also connected together.

The SCR anode 88 is connected from junction 94. The SCR cathode 89 is connected to junction 93. Resistor 91 is connected between junctions 94 and 95. Capacitor 92 is connected between junctions 95 and 96.

A transistor 102 is provided having a collector 103, an emitter 104 and a base 105.

Transistor collector 103 is connected to SCR gate 90. Transistor emitter 104 is connected to junction 93. Transistor base 105 is connected to junction 95.

As will no doubt now be apparent, a corresponding lamp, such as one of the lamps 25, 27, 29 and 31 illustrated in FIG. 1, illuminate a corresponding SCR 83, 84, or 85.

Junctions 94 and 96 are again connected across a full wave bridge rectifier including diodes 106, 107, 108 and 109.

Diode 106 is connected from junction 97 to junction 98, and is poled to be conductive in a direction toward junction 98. Diode 107 is connected from junction 99 to junction 98 and is poled to be conductive in a direction toward junction 98. Diode 108 is connected from junction 100 to junction 99 and is poled to be conductive in a direction toward junction 99.

Diode 109 is connected from junction 100 to junction 97 and is poled to be conductive in a direction toward junction 97.

A triac is illustrated at 110. Triac 110 has terminals 111, 112, 113 and 114. A lead 115 connects terminals 111 and 112, and is connected to junction 101. Traic 110 has opposite sides 116 and 117 connected respectively to junction 101 and terminal 113.

Triac 110 has a gate 118 connected to terminal 114. Terminal 114 is connected from junction 97. Terminal 111 is connected from junction 99.

Zero voltage switch 82 has output leads 119 and 120 connected to output terminals 121 and 122, respectively. Leads 119 and 120 are also connected respectively from triac terminals 112 and 113.

In the operation of the zero voltage switch 82 shown in FIG. 3, the charge on capacitor 92 cannot change abruptly even though it may have some predetermined average charge. That is, some small amount of time is required to charge capacitor 92 further through resistor 91 when the potential of junction 94 rises above the potential of junction 95. Thus, for a short time when the potential of junction 94 is small and positive with respect to that of junction 96, SCR 83 can turn on. If it has illumination sufficient to turn on, the gate-to-cathode clamping action of transistor 102 is disabled by the conduction of SCR 83, and the said clamping action thus has no effect on further conduction of SCR 83. Firing of the SCR 83 is not possible at any time other than said short time because transistor 102 otherwise clamps gate 90 to cathode 89 and holds off SCR 83. This can be important for a number of reasons.

When SCR 83 does not turn on during the said short time, it never turns on during the remainder of the half cycle which immediately succeeds the said short time.

Note will be taken that SCR 83, when turned on, effectively short circuits junctions 98 and 100. This, in turn, short circuits terminals 111 and 114 of triac 110 and the triac 110 is then turned on.

In FIG. 4, zero voltage switch 86 is provided to effect a pulsating output to heat up elements.

Zero voltage switch 86 includes the SCR 84, as stated previously. SCR 84 has an anode 123, a cathode 124 and a gate 125. Various junctions 126, 127, 128, 129, 130, 131, 132, 133, 134 and 135 are provided throughout the circuit.

A transistor 136 is provided including a collector 137, an emitter 138 and a base 139.

Junctions 130, 131 and 134 are connected together. Junctions 127, 129, 133 and 135 are all connected together.

SCR anode 123 is connected from junction 130. SCR cathode 124 is connected to junction 127. SCR gate 125 is connected to junction 126. Junctions 126 and 128 are connected together.

A resistor 140 is connected between junctions 126 and 127.

Transistor collector 137 is connected from junction 128. Transistor emitter 138 is connected to junction 129.

A resistor 141 is connected from junction 130 to transistor base 139.

A resistor 142 is connected between junctions 126 and 132. A capacitor 143 is connected between junctions 132 and 133. A resistor 144 is connected between junctions 131 and 132.

In the operation of the zero voltage switch 86, the capacitor 143 permits the SCR 84 to fire only during certain spaced intervals. A triac 145 then only provides a closed circuit between output terminals 146 and 147 at the said spaced intervals.

The remainder of the zero voltage switch 86, shown in FIG. 4, and the operation of the said remainder is identical to corresponding identical portions of the zero voltage switch 82 shown in FIG. 3. The same is true of similar structure shown in zero voltage switch 87 of FIG. 5, except for a resistor 148 and a capacitor 149 connected in series in that order from a junction 150 to a junction 151. Resistor 148 and capacitor 149 are employed to take care of the conductive reactance of a relay (not shown) which may be used in lieu of triac 155.

When compressor 152 is employed, preferably a resistor and capacitor are connected in series between terminals 112′ and 133′. Resistor 148 and capacitor 149 are preferably used when a relay is employed, but may or may not be omitted in all other cases, if desired. Resistor 148 and capacitor 149 may or may not be omitted when triac 155 is employed.

Junctions 150 and 151 are connected respectively to terminals 153 and 154 of triac 155.

In FIG. 5, zero voltage switch 87 includes the SCR 85, as stated previously. SCR 85 includes an anode 156, a cathode 157 and a gate 158. Various junctions are illustrated throughout the circuit including junctions 159, 160, 161, 162, 163, 164, 165, 166, 167, 168, 169, 170 and 171.

Junctions 160, 166 and 170 are connected together. Junctions 159, 164, 165, 169 and 171 are also connected together.

SCR anode 156 is connected from junction 160. SCR cathode 157 is connected to junction 159. A transistor 172 is provided having a collector 173, an emitter 174 and a base 175. SCR gate 158 is connected to transistor collector 173. Transistor emitter 174 is connected to junction 159.

A resistor 176 is connected from junction 160 to junction 161. A resistor 177 is connected from junction 161 to junction 162.

Transistor base 175 is connected from junction 162. A resistor 178 is connected between junctions 161 and 163. A capacitor 179 is connected between junctions 163 and 164.

A component conventionally described as a programmable unijunction transistor 180 is provided. Transistor 180 is functionally the same as an SCR having an anode lead 181, a gate lead 181 and a cathode 183.

Anode lead 181 of transistor 180 is connected from junction 167. Gate lead 182 of transistor 180 is connected from junction 163. A resistor 184 is connected from emitter 183 to junction 165. A resistor 185 is connected between junctions 168 and 162.

Junctions 167 and 168 are connected together. A resistor 186 is connected between junctions 166 and 167. A capacitor 187 is connected between junctions 168 and 169.

In the operation of the zero voltage switch 87 shown in FIG. 5, the use of the capacitors 179 and 187 with the unijunction transistor 180 prevents SCR 85 from firing for, for example, a length of time equal to two minutes after compressor 152 has been turned off.

The following circuit values may be employed, if desired. However, these circuit values are given by way of example only.

| | |
|---|---|
| Amplifier 66 | 741 Operational Amplifier |
| Capacitor 92 | 470 picofarads |
| Capacitor 143 | 10 microfarads |
| Capacitor 179 | 1,000 picofarads |
| Capacitor 187 | 10 microfarads |
| Potentiometer 62 | 100,000 ohms |
| Resistor 72 | 100 ohms |
| Resistor 73 | 47,000 ohms |
| Resistor 74 | 47,000 ohms |
| Resistor 75 | 1 ohm |
| Resistor 81 | 100 ohms |
| Resistor 91 | 1.5 megohms |
| Resistor 140 | 56,000 ohms |
| Resistor 141 | 1.5 megohms |
| Resistor 142 | 2 megohms |
| Resistor 144 | 5 megohms |
| Resistor 176 | 470,000 ohms |
| Resistor 177 | 1 megohm |
| Resistor 178 | 1 megohm |
| Resistor 184 | 10,000 ohms |
| Resistor 185 | 40 megohms |
| Resistor 186 | 40 megohms |
| Thermistor 65 | 50,000 ohms |
| Transistor 76 | 2N4125 |
| Transistor 136 | 2N3566 |
| Transistor 172 | 2N3566 |
| SCR 83 | MLS-105 |
| SCR 84 | MLS-105 |
| SCR 85 | MLS-105 |
| Unijunction Transistor 180 | 2N6027 |

It will be noted that, if desired, diode 80 may be short circuited and omitted. Further, amplifier 66 may be constructed so as to contain transistor 76 and resistor 81 internally thereof. In this case, the output lead of amplifier 66 would be connected to junction 59.

Light emitting diode 80 may or may not be connected between amplifier output lead 71 and junction 59, as desired, either when transistor 76 and resistor 81 are omitted or not, or when they are employed internally of amplifier 66 or not.

Resistor 81 is a current limiting resistor. Resistor 81 protects the circuit of FIG. 2 and, more particularly, transistor 76 should the load be short circuited.

It will also be referred to herein that amplifier output lead 71 is connected to junction 52. It is, in fact, so connected. Note that amplifier output lead 71 is connected to junction 59 through diode 80, the base-emitter circuit of transistor 76, and from transistor emitter 78 to junction 59.

It is an advantage in accordance with the present invention that the lamps 25, 27, 29 and 31 are incandescent lamps. The thermal inertia thereof prevents substantial decay of light intensity during intervals between immediately adjacent pairs of alternate half cycles.

In addition to the reasons given hereinabove, it is important that the zero voltage switches cannot operate except at or near zero voltage because they would otherwise cause radio frequency interference (RFI).

To demonstrate how the zero voltage switches operate only near zero, in FIG. 3, for example, junction 94 may reach a peak potential at 240 $\sqrt{2}$ volts, whereas transistor 102 has a threshold level of only about 0.6 volts.

The chopping period of the zero voltage switch 86, shown in FIG. 4, may be 10 to 20 seconds, if desired.

The phrase "means to impress an A.C. voltage" used in any of its grammatical forms herein or in the claims is hereby defined in each case to mean a transformer, either one of two conductive leads or otherwise.

The phrase "zero voltage switch" is hereby defined for use herein and in the claims to mean the said conventional zero voltage switch, any of the zero voltage switches disclosed herein, any equivalents of any of the foregoing or otherwise and which may or may not include a source of illumination for a light activated SCR.

Note will be taken that the system of the present invention nor any of its components are limited to providing either electric heat or cooling by any particular apparatus. For example, the present invention may be applied to, for example, gas heating. In this case, a triac or a relay in lieu thereof in each of the embodiments of switches 34 and 35 may be employed to turn on a gas valve.

If a relay is employed, resistor 148 and capacitor 149 of FIG. 5 may be employed to nullify the damaging effect produced by the switching off of the relay winding because of the inductive reactance of the relay winding.

If it is not already apparent from the foregoing, the thermostat 15 is of the modulating type. That is, it does not snap. It also can be provided with hysteresis, if desired.

As is well known, polarities may be reversed by substituting PNP type transistors for NPN transistors, and vice versa, and making other similar changes wherever necessary. For example, the poling of diodes in some cases may need be reversed.

In some instances, either one or both of the resistors 72 and 75 may be short circuited and eliminated. Further, transistor 76, diode 80 and resistor 81 may be eliminated, and amplifier output lead 71 connected directly to junction 59, if desired.

Thermistor 65 has a negative temperature coefficient of resistance. However, a temperature sensitive resistor may be substituted for resistor 65 which has a positive temperature coefficient of resistance. If this reversal is made, diodes 24, 26, 28 and 30 must be poled in directions opposite to those shown in FIG. 1.

The word "connected" in any of its grammatical forms as used herein and in the claims is hereby defined to mean, in each case, a resistor, any other circuit component, a conductive lead or otherwise.

Solid state thermostats are not broadly new in this art. As in many of the prior art cases, adjustment of wiper 64 on potentiometer winding 63 determines the set point of thermostat 15 in FIG. 2.

Resistor 73 or resistor 74 may be variable to increase or to decrease the offset voltage of the amplifier 66. Potentiometers may be added, if desired, to the thermostat 15 of FIG. 2 at various locations therein to accomplish the same purpose.

Each of the lamps 25, 27, 29 and 31 may illuminate two or more zero voltage switches, if desired.

It is possible to omit, for example, diodes 26 and 30, and lamps 27 and 31. Lamp 25 could then illuminate both of the zero voltage switches 32 and 33, while lamp 29 could illuminate both of the zero voltage switches 34 and 35.

Resistor 75 in FIG. 2 may be 1 ohm or substantially more than 1 ohm for adjusting the temperature over which modulation occurs.

What is claimed is:

1. A light sensitive zero voltage switch comprising: a photosensitive silicon-controlled rectifier (SCR) having an anode, a cathode and a gate; a transistor having collector, emitter and base electrodes; a full wave bridge rectifier; and a triac having first and second sides; first and second output leads connected from said first and second triac sides, respectively, said bridge rectifier including first, second, third and fourth junctions and first, second, third and fourth diodes, said triac having a gate connected from said second side thereof to said first junction, said third junction being connected to said first output lead, said first diode being connected between said first and second junctions and poled to be conductive toward said second junction, said second diode being connected between said second and third junctions and poled to be conductive toward said second junction, said third diode being connected between said third and fourth junctions and poled to be conductive toward said third junction, said fourth diode being connected between said first and fourth junctions and poled to be conductive toward said first junction, said transistor collector and emitter electrodes being connected to said SCR gate and cathode, respectively, said SCR cathode being connected to said fourth junction, a fifth junction, said SCR anode being connected from said fifth junction, said second and fifth junctions being connected together; resistor means connected from said transistor base electrode to said fifth junction; capacitor means connected from said fourth junction to one of said transistor electrodes to inhibit firing of said SCR; sixth, seventh, eighth, ninth, tenth, eleventh and twelth junctions, said resistor means including a first resistor connected between said fifth and sixth junctions, a second resistor connected from said sixth junction to said transistor base electrode a thirteenth junction, a first capacitor connected between said eighth and thirteenth junctions, both of said twelth and thirteenth junctions being connected to said fourth junction, a third resistor connected between said sixth and eighth junctions a unijunction transistor having first and second bases and an emitter, said first and second bases being connected from said eighth and tenth junctions, respectively, a fourth resistor connected from said emitter to said fourth junction, a fifth resistor connected between said seventh and eleventh junctions, said seventh junction being connected to said transistor base electrode, said tenth and eleventh junctions being connected together, a sixth resistor connected between said ninth and tenth junctions, said ninth junction being connected to said second junction, said capacitor means including a second capacitor connected between said eleventh and twelth junctions, said twelth and fourth junctions being connected together.

* * * * *

UNITED STATES PATENT OFFICE
CERTIFICATE OF CORRECTION

Patent No. 3,881,119 Dated April 29, 1975

Inventor(s) Elmer A. Carlson Page 1 of 3

It is certified that error appears in the above-identified patent and that said Letters Patent are hereby corrected as shown below:

The drawings should be canceled and the attached drawings substituted therefor.

Signed and Sealed this

*ninth* Day of *March 1976*

[SEAL]

*Attest:*

RUTH C. MASON
*Attesting Officer*

C. MARSHALL DANN
*Commissioner of Patents and Trademarks*